(12) United States Patent
Capello et al.

(10) Patent No.: US 7,947,571 B2
(45) Date of Patent: May 24, 2011

(54) METHOD FOR FABRICATING A SEMICONDUCTOR ON INSULATOR SUBSTRATE WITH REDUCED SECCO DEFECT DENSITY

(75) Inventors: Luciana Capello, Grenoble (FR); Oleg Kononchuk, Theys (FR); Eric Neyret, Sassenage (FR); Alexandra Abbadie, Le Versoud (FR); Walter Schwarzenbach, Saint Nazaire Eymes (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 12/478,063

(22) Filed: Jun. 4, 2009

(65) Prior Publication Data
US 2010/0052092 A1    Mar. 4, 2010

(30) Foreign Application Priority Data
Sep. 3, 2008   (EP) .................................. 08290825

(51) Int. Cl.
*H01L 21/762*    (2006.01)
(52) U.S. Cl. ............................ 438/458; 257/E21.568
(58) Field of Classification Search .......... 438/458, 438/455, 459; 257/E21.567–E21.569
See application file for complete search history.

(56) References Cited

U.S. PATENT DOCUMENTS

| | | | |
|---|---|---|---|
| 6,239,004 B1 | 5/2001 | Aga et al. | 438/455 |
| 6,403,450 B1 | 6/2002 | Maleville et al. | 438/471 |
| 6,903,032 B2 | 6/2005 | Maleville et al. | 438/796 |
| 7,235,427 B2 | 6/2007 | Barge et al. | 438/115 |
| 7,326,628 B2 | 2/2008 | Ben Mohamed et al. | 438/458 |
| 2004/0060899 A1 | 4/2004 | Waldhauer et al. | 216/2 |
| 2004/0060900 A1 | 4/2004 | Waldhauer et al. | 216/2 |
| 2004/0142542 A1* | 7/2004 | Murphy et al. | 438/479 |
| 2005/0026426 A1* | 2/2005 | Maleville et al. | 438/663 |
| 2005/0208322 A1 | 9/2005 | Barge et al. | 428/620 |
| 2006/0014363 A1 | 1/2006 | Daval et al. | 438/455 |
| 2006/0177991 A1 | 8/2006 | Murakami et al. | 438/455 |
| 2006/0202310 A1 | 9/2006 | Murphy et al. | 257/619 |
| 2007/0148910 A1* | 6/2007 | Neyret et al. | 438/455 |

(Continued)

FOREIGN PATENT DOCUMENTS
EP    0 955 670    11/1999

OTHER PUBLICATIONS
European Search Report, EP08290825, dated Jan. 23, 2009.
(Continued)

*Primary Examiner* — Matthew Smith
*Assistant Examiner* — Daniel Shook
(74) *Attorney, Agent, or Firm* — Winston & Strawn LLP

(57) ABSTRACT

The invention relates to a method for fabricating a semiconductor on insulator substrate, in particular a silicon on insulator substrate by providing a source substrate, providing a predetermined splitting area inside the source substrate by implanting atomic species, bonding the source substrate to a handle substrate, detaching a remainder of the source substrate from the source-handle component at the predetermined splitting area to thereby transfer a device layer of the source substrate onto the handle substrate, and thinning of the device layer. To obtain semiconductor on insulator substrates with a reduced Secco defect density of less than 100 per $cm^2$ the implanting is carried out with a dose of less than $2.3 \times 10^6$ atoms per $cm^2$ and the thinning is an oxidation step conducted at a temperature of less than 925° C.

17 Claims, 2 Drawing Sheets

U.S. PATENT DOCUMENTS

2007/0212852 A1* 9/2007 Tauzin et al. .......... 438/458
2008/0014713 A1 1/2008 Neyret et al. .......... 438/455
2008/0020514 A1 1/2008 Okuda et al. .......... 438/115

OTHER PUBLICATIONS

Giles, L.F. et al., "Delineation of Defects in Simox Structures Using a Chemical Etching Technique", Vacuum, vol. 43, No. 4, pp. 297-299, 1992.

Giles, L.F. et al., "A New Chemical Etch for Defects Studies in Very Thin Film (<1000 Å) Simox Material", Materials Chemistry and Physics, vol. 35, pp. 129-133, 1993.

Aspar B. et al., "Characterization of Soi Substrates: Application to Recent Simox and Unibond® Wafers", Electrochemical Society Proceedings, vol. 96, No. 3, pp. 99-111, 1996.

F. Secco d'Aragona, "Dislocation Etch for (100) Planes in Silicon", J. Electrochem. Soc., vol. 119, No. 7, pp. 948-951 (1972).

L. P. Giles et al., "Nucleation, Growth And Retrogrowth Of Oxidation-Induced Stacking Faults In Thin Silicon-On-Insulator"; Journal of Electronic Materials, vol. 28, No. 1, pp. 13-18 (1999).

L. P. Giles et al., "Crystallographic Defects In Thermally Oxidized Wafer Bonded Silicon On Insulator (SOI) Substrates"; Journal of Electronic Materials, vol. 28, No. 4, pp. 372-376 (1999).

G. Silvestre et al., "A Study Of The Growth And Shrinkage Of Stacking Faults In Simox"; Materials Science and Engineering, vol. B; 29, pp. 24-28 (1995).

M. S. Carrol, et al., "Quantitative Measurement Of Interstitial Flux And Surface Super-Saturation During Oxidation Of Silicon"; Materials research Society Symp., vol. 610, pp. B4.10.1-B4.10.6 (2000).

* cited by examiner

METHOD FOR FABRICATING A SEMICONDUCTOR ON INSULATOR SUBSTRATE WITH REDUCED SECCO DEFECT DENSITY

BACKGROUND ART

The invention relates to a method for fabricating a semiconductor on insulator (SeOI) substrate, in particular a silicon on insulator (SOI) substrate, that has a reduced density of Secco Defects. The method generally comprises the steps of providing a source substrate, providing a predetermined splitting area inside the source substrate, attaching, preferably by bonding, the source substrate to a handle substrate, detaching a remainder of the source substrate from the source handle component at the predetermined splitting area to thereby transfer a device layer of the source substrate onto the handle substrate, and thinning of the device layer. The implanting and thinning steps are conducted under controlled conditions such that the thinned device layer exhibits a reduced Secco Defect Density. The term "device layer" and "transfer layer" are used interchangeably herein to designate a layer which is part of the source substrate that is transferred to the handle substrate and in which electronic devices or other components can be formed.

Such semiconductor on insulator substrates, like the mentioned silicon on insulator substrates, typically present a certain amount of different defects, e.g., crystalline defects, point defects, metallic contamination, etc. One particular type of defect is a so-called Secco defect. In the past, these defects were not considered to be critical as the number of such defects was sufficiently low for typical SOI applications, e.g., supporting logic circuits. Today, however, new applications are being developed for SeOI and SOI technology, e.g., memory devices, such that the SeOI substrates need to present much lower Secco defects than in the past. In particular, the Secco defect density should be less than 100 per $cm^2$, whereas, up to now, this value was higher by a factor of about five.

FIG. 1 illustrates the standard process of determining Secco defects in SOI structures. This process has been further described in L. F. Giles, A. Nejim, P. L. F. Hemment, Vacuum 43, 297 (1992) or by the same authors in Materials Chemistry and Physics 35 (1993) 129-133. The concentration of Secco defects can be determined by displaying them by virtue of a solution of Secco type, the composition of which is known from the above mentioned documents. Starting from a SOI substrate 1 comprising a device layer 3 with a thickness of e.g., 2000 Å and a silicon oxide layer 5 with a thickness of e.g., 4000 Å on a silicon wafer 7, a standard technique for displaying defects by virtue of a solution of Secco type comprises the steps that are now described.

A first stage (A) requires immersing the substrate 1 for several seconds, for example 10 to 25 seconds, in a solution of Secco type in order to etch 1000 to 2000 Å of silicon from the device layer 3 and more rapidly to selectively etch this device layer 3 at the crystal defects 9 in the material until holes 11 corresponding to the sites of the defects 9 open onto the silicon oxide layer 5. The duration of stage A depends on the thickness to be removed and has to be such that all Secco defects can be identified. As a rule of thumb, at least half of the thickness of the device layer is removed, but for thicker layers this might be much more, even as much as 85% of the thickness is removed. For example, 300 to 500 Angstroms of thickness can remain, even for device layers that originally have a thickness between 1000 and 2000 Angstroms. On the other hand, for very thin device layers (800 Angstroms or even less than 500 Angstroms), it might be sufficient to remove less than half of that thickness because all Secco defects are revealed at that point, i.e., the Secco defects penetrate the device layer even before half of the thickness is etched away.

A second stage (B) requires immersing the substrate 1 in a hydrofluoric acid solution in order to etch the holes 11 produced in the preceding stage, by widening them in the dielectric layer 5. Following this treatment, the holes 11 which remain are sufficiently large so that they can be counted under a microscope. It appears that, at a certain remaining device layer 3 thickness, the defect density stabilizes and reaches an upper limit value indicating that, starting from this thickness, all defects in the original layer are visualized. In the case of standard semiconductor on insulator substrates, stabilization is achieved around 500 Å or at the latest when around 300 Å of device layer 3 thickness remains. Indeed, it appears that the device layer 3 in the zone of Secco defects etches approximately twice as fast as the normal device layer in zones without Secco defects.

US 2005/0208322 discloses a method for fabricating a semiconductor on insulator substrate dealing with removal of defects. The proposed process is a SmartCut® type process which comprises additional steps to transfer a semiconductor device layer from a source substrate onto a handle substrate to reduce the number of defects. These additional steps comprise a sacrificial oxidation stage transforming a part of the device layer into an oxide, which is removed, followed by a polishing stage. With the implementation of these additional steps, defects in the surface regions can be removed. However, the polishing stage introduces additional defects which are then removed by a second sacrificial oxidation stage oxidizing a surface part of the semiconductor device layer and removing the oxidized portions. With this method, Secco defects in a range of about 500 defects per $cm^2$ can be achieved. This method is not desirable as it has the disadvantage that an additional process step is necessary and, furthermore, that it is not possible to achieve the new requirements for defect levels of 100 defects per $cm^2$ or lower.

Other SOI manufacturing processes have been proposed which do not include the additional polishing step. US 2005/0026426 proposes a thermal treatment to minimize high frequency roughness so that chemical mechanical polishing is not needed. This type of process, in particular, includes a high temperature anneal of the silicon on insulator substrate with the device layer being protected by a layer of silicon oxide, a technique known as "stabilization oxidation anneal". However, this type of long and high temperature anneal can generate other types of defects such as slip lines. Furthermore, these kind of anneal steps require furnaces that can sustain high temperatures which are generally relatively expensive and difficult to control in terms of contamination.

It appears that these known processes are not suitable to reduce Secco defect densities to lower than 100 per $cm^2$ and that, for device layers of less than 1000 Å, the described methods do not lead to satisfying results. Now, however, the present invention provides a semiconductor on insulator wafer fabrication method that produces a Secco defect density of less than 100 defects per $cm^2$ and the method can be applied to relatively thin device layers to overcome the shortcomings of the prior art.

SUMMARY OF THE INVENTION

Accordingly, the invention relates to a method for fabricating a semiconductor on insulator substrate having a surface semiconductor layer that has a reduced Secco defect density, which comprises providing a predetermined splitting area in a source substrate by implanting atomic species with a dose of less than $2.3\times10^{16}$ atoms/cm$^2$ to define a transfer layer in the source substrate; attaching the source substrate to a handle substrate to form a source-handle component; detaching the transfer layer from the source substrate from the source-handle component at the predetermined splitting area to thereby transfer that layer from the source substrate to the handle substrate; and thinning the transfer layer at a temperature of room temperature (i.e., 20 to 25° C.) to less than 925° C. and for a time sufficient to provide a Secco defect density of less than 100 defects per cm$^2$ in the transfer layer.

The invention also relates to a semiconductor on insulator wafer, in particular, a silicon on insulator wafer, comprising a transfer layer, an insulating layer and a supporting substrate, wherein the transfer layer exhibits a Secco defect density of less than 100 defects per cm$^2$.

BRIEF DESCRIPTION OF THE FIGURES

The invention will now be described in detail in conjunction with the enclosed Figures, wherein.

DETAILED DESCRIPTION OF THE PREFERRED EMBODIMENTS

Figure 1:
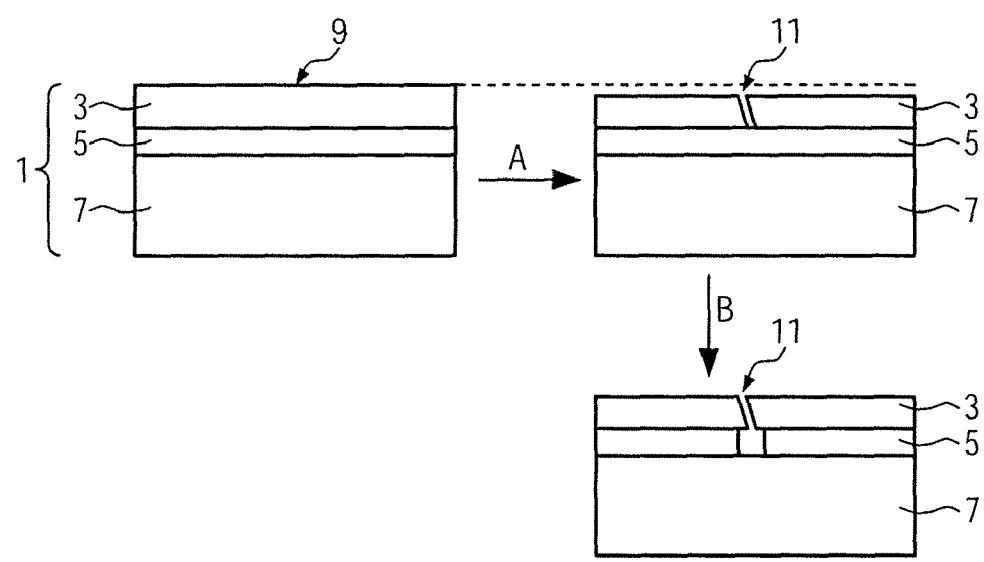
FIG. 1 illustrates the known process for determining the Secco defects.

As noted herein, the inventive method comprises the steps of providing a source substrate, providing a predetermined splitting area inside the source substrate, attaching, preferably by bonding, the source substrate to a handle substrate to form a source handle component, detaching a remainder of the source substrate from the source-handle component at the predetermined splitting area to thereby transfer a device layer of the source substrate onto the handle substrate and thinning of the device layer. To achieve the desired low level of Secco defects, the predetermined splitting area is provided by implanting atomic species with a dose of less than $2.3\times10^{16}$ atoms per cm$^2$ and the thinning is carried out at a temperature of less than 925° C., e.g. between 850° C. and 925° C.; preferentially between 850° C. and 875° C., for a time of between several minutes and several hours, e.g., 2 minutes to 5 hours.

It appears that, even though each one of the process parameters might have been previously known individually, it is the special combination of the process parameters which leads to a surprisingly high reduction in Secco defects down to less than 100 defects per cm$^2$ or even less than 50 defects per cm$^2$, in particular for final device layer thicknesses of less than 1000 Å. In the claimed temperature regime, a good balance between throughput and Secco defect densities can be achieved. In case one is interested in reducing Secco defect density even further, preferred temperature ranges are less than 900° C., or even less than 850° C. A minimum temperature is room temperature. The SEOI substrate is held at that temperature for a time of between a few minutes and several hours, with the longer times being requires for the lower temperatures and shorter times being used for the higher temperatures. A preferred time period for this temperature treatment is 30 minutes to 4 hours.

Preferably, the method can comprise a thermal treatment step before and/or after the thinning. Even further preferred can be a rapid thermal anneal (RTA) step of a duration of at least 30 seconds, in particular between 30 seconds and 90 seconds, more in particular between 45 seconds and 75 seconds at a temperature of at least 1200° C. to about 1300° C., in particular at about 1250° C. Such a rapid thermal anneal step does not only lead to a reduction in surface roughness but it has furthermore been observed that synergistic effects with respect to Secco defects are observed in combination with the above mentioned process parameters so that the number of Secco defects can be even further reduced.

According to a variant of the invention, the thermal treatment step can be a furnace anneal of at least 10 minutes in a temperature range of 1000 to 1200° C. With such a thermal treatment step, not only the surface roughness can be reduced but, furthermore, the Secco defect density can also be optimized. Advantageously, the thermal treatment step can be carried out under non-oxidizing atmosphere such as Hydrogen, Helium, Argon or mixtures thereof and in particular under Argon. Under this atmosphere, a further optimization of surface roughness, as well as Secco defects, has been observed. According to a further advantageous embodiment, the thermal treatment step can comprise two or more successive rapid thermal treatment steps. Better annealing results are obtained by carrying out multiple short RTA runs compared to one long run.

The predetermined splitting area can be achieved using Helium and Hydrogen ions with a dose of $1.4\times10^{16}$ atoms/cm$^2$ or less, in particular in a range of $1.2\times10^{16}$ atoms/cm$^2$ to $1.4\times10^{16}$ atoms/cm$^2$, more in particular in a range of $1.3\times10^{16}$ atoms/cm$^2$ to $1.4\times10^{16}$ atoms/cm$^2$, or and $0.9\times10^{16}$ atoms/cm$^2$ or less, in particular in a range of $0.7\times10^{16}$ atoms/cm$^2$ to $0.9\times10^{16}$ atoms/cm$^2$, more in particular in a range of $0.8\times10^{16}$ atoms/cm$^2$ to $0.9\times10^{16}$ atoms/cm$^2$, respectively. Under these process conditions, a further reduced Secco defect density can be achieved. In particular, the combination of two different types of ions plays a role in reducing Secco defects. According to a preferred embodiment, implanting can be carried out at an energy of 49 keV or less concerning Helium. Reducing the energy of the ions, in particular of the Helium ions, to 49 keV or less, has revealed a further reduction in the Secco defect density.

Preferably, the thinning can comprise at least a first and a second thinning step. Splitting the thinning step into two or more distinct steps has shown better results concerning the amount of Secco defects compared to having only one thinning step, in the case of thinning by thermal oxidation and des-oxidation. This result can be even further improved when a rapid thermal annealing (RTA) step is carried out between both thinning steps. Other temperature treatments can be carried out after the first and second thinning steps, respectively. Again, not only the surface roughness value can be optimized but, at the same time, Secco defects can be reduced by combining a thinning step with a rapid thermal anneal or similar temperature treatment step.

The thinning may comprise oxidizing the device layer. Thinning in this context is thus achieved by consuming a part of the transferred device layer by oxidation. Later in the process, a removal step can be carried out to remove the oxidized region with a suitable process, e.g., etching, which conveniently achieves the desired result.

Preferably, the thickness reduction for the device layer can be larger for the second thinning step than for the first thinning step. By doing so, it has been found that the Secco defect density appears to further diminish, and this is particularly so when a rapid thermal annealing step is carried out between the thinning steps. According to a variant, the thinning can be achieved by at least one of wet etch, dry etch and etching under HCl and H. While the wet etch is typically carried out at room temperature, the dry etch and etching under HCl and H are carried out at a temperature of less than 925° C., for example between 900° C. and 925° C. Here the process can thus be carried out at rather low temperatures.

After thinning, the device layer has a thickness of 1000 Å or less. As already described herein, the prior art processes do not lead to sufficiently low Secco defect densities for thin or thinned device layers of 1000 Å, whereas the advantageous combination of different process parameters also leads to reduced Secco defects in very thin device layers of 1000 Å and less.

Finally, semiconductor on insulator wafers, and in particular, silicon on insulator wafers including those fabricated according to one of the methods described herein and having reduced Secco defect densities, represent yet another embodiment of the invention. Those wafers typically have diameters of 300 mm.

Figure 2A:
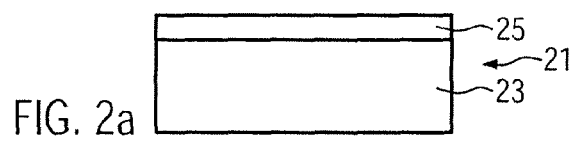
FIGS. 2A-2H illustrate one embodiment of the inventive method for fabricating a semiconductor on insulator substrate with reduced Secco defect density.

Turning now to the drawings, FIG. 2A illustrates the source substrate 21, here a silicon wafer, e.g. a 300 mm silicon wafer, comprising a silicon base 23 and a silicon oxide layer 25 which is the natural silicon oxide but could also be a deposited or artificially grown silicon oxide layer or any other suitable dielectric layer.

Figure 2B:
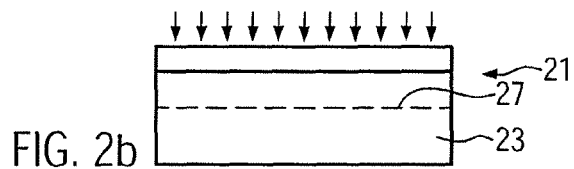

According to the invention, atomic species, here a mixture of Helium and Hydrogen ions, are implanted with a dose not exceeding $2.3 \times 10^{16}$ atoms/cm$^2$. Also, the Helium is implanted at an energy of at least 24 keV to 85 keV and the Hydrogen is implanted at an energy of at least 16 keV to 50 keV to further diminish the Secco defect density of the transfer layer. According to an advantageous variant of the invention, the Helium ions are implanted with a dose of $1.4 \times 10^{16}$ atoms/cm$^2$ and the Hydrogen ions with a dose of $0.9 \times 10^{16}$ atoms/cm$^2$. The energy of the ions is, according to this embodiment, 49 keV for Helium and 32 keV for Hydrogen. This leads to about 2450 Å depth of implantation. The implanting of the ions, indicated by a series of arrows in FIG. 2B, leads to the formation of a predetermined splitting area 27 inside the source substrate 21, here inside the silicon base 23 essentially parallel to the main surface of the source substrate 21.

Figure 2C:
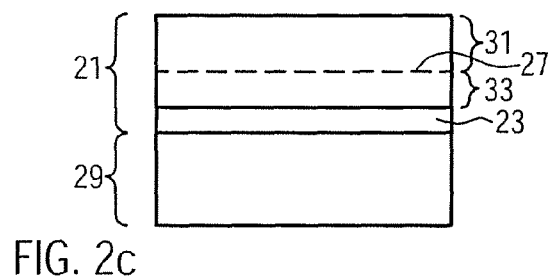

FIG. 2C illustrates the subsequent attachment of the source substrate 21, preferably by bonding via the oxide layer 23, with a handle substrate 29, in this example also a 300 mm silicon wafer with or without dielectric layer, to form a source-handle component. Instead of a silicon wafer, any other suitable handle substrate 29 could be used.

Figure 2D:
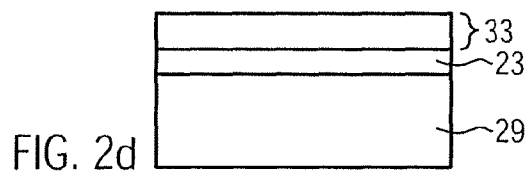

By providing thermal or mechanical energy, the predetermined splitting area 27 (FIG. 2C) is further weakened which in turn leads to a complete detachment of a remainder 31 of the source substrate 21 and the transfer of a device layer 33, together with the dielectric layer 23, onto the handle substrate 19, as illustrated in FIG. 2D. The transferred layers have a transferred thickness of about 2450 Å, corresponding to an intermediate wafer product. After the thinning steps of the manufacturing process, the final device layer is thinner, for example 1000 or 800 Å or less. This corresponds thus to the final wafer product.

Figure 2E:
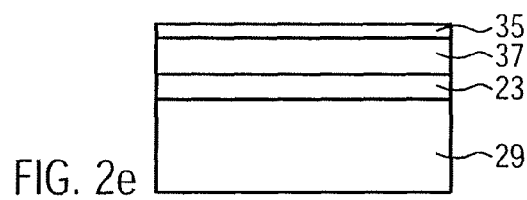

The next process step is one of a sacrificial oxidation which, according to the invention, is carried out at a temperature of less than 925° C., in particular between 850° C. and 925° C., more in particular between 850° C. and 875° C. The aim of this step is to reduce the thickness of the device layer by transforming a part of the transferred silicon of device layer 33 into a silicon oxide 35. Thus, by doing so, the silicon part of transferred device layer 37 is thinner (see FIG. 2E). Typically 800 Å of the device layer 33 are transformed during this step. In case that throughput plays a secondary role, it is even possible to carry out the process at less than 900° C., in particular at less than 850° C.

Instead of or in addition to a sacrificial oxidation, it is also possible to carry out an etch step under HCl and H atmosphere to partially remove the device layer.

Subsequently, a rapid thermal anneal step is carried out which serves to reduce the roughness. According to this embodiment, the rapid thermal anneal is carried out at a temperature of at least 1200° C., in particular at about 1250° C. for at least 30 seconds, preferably between 30 to 90 seconds, more in particular between 45 to 75 seconds.

Figure 2F:
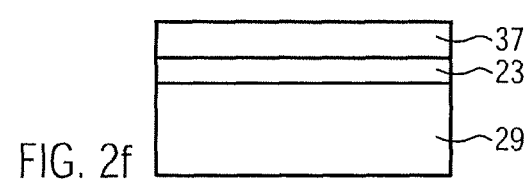
Figure 2G:
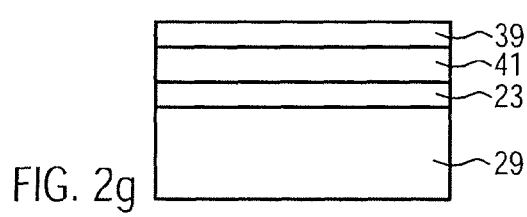

As a next step, the oxide layer 35 is removed by a standard process, like etching using e.g. a HF solution. This leads to the situation as illustrated in FIG. 2F wherein the structure comprises the base 29, the transferred oxide layer 23 and the thinned device layer 37.

Subsequently, a second oxidation step is carried out by oxidation which leads to a partial consumption of the already thinned device layer 37 which is turned into an oxide 39 so that the remaining thinned device layer 41 now has a thickness of 1000 Å or less. Also, this oxidation step is carried out at less than 925° C.

Figure 2H:
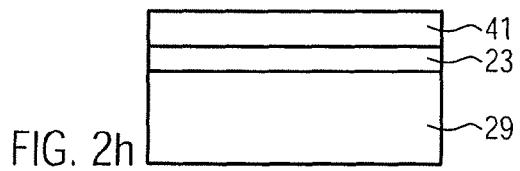

Thereafter, another rapid anneal step is carried out at 1200° C., in particular at 1250° C. for at least 30 seconds, and in particular between 30-90 seconds, more particularly between 45-75 seconds, preferably under an Argon atmosphere and/or Helium atmosphere and/or Hydrogen atmosphere. Finally, an additional removal step is carried out to remove the oxide layer 39 to achieve the final structure comprising a thinned device layer 41 on a dielectric layer 23 and the base 29, as illustrated in FIG. 2H.

The inventive method according to the described embodiment has the advantage that each process step is optimized such that synergistic effects occur which lead to an important reduction in Secco defects, namely with a density being lower than 100 defects per cm$^2$ or even lower than 50 defects per cm$^2$. This optimization is achieved with a choice of a low ion implantation density and the choice of a low oxidation temperature when reducing the thickness of the transferred layer. In addition, the special process parameters of the rapid thermal anneal step also lead to a reduction of the Secco defect density. Furthermore, the splitting of the thinning into two distinct steps further helps in keeping the Secco defects low. The process parameter mix is furthermore such that device layers of less than 1000 Å can be provided with the mentioned low Secco defect density.

Without departing from the inventive concept, the invention according to the first embodiment can be carried out under the following variants. First of all, instead of only carrying out one RTA step after each oxidation, it is further beneficial to carry out at least two or more RTAs successively. According to another embodiment, the thermal treatment step can also be a furnace anneal of at least 10 minutes carried out in a temperature range of 1000 to 1200° C., in an Argon atmosphere. According to a further variant, the oxidation as a thinning step can be replaced by a wet etch, dry etch or an etching under HCl and H.

By carrying out this first embodiment or any of the variants alone or in combination, Secco defect densities of less than 100 per cm$^2$, in particular less than 50 per cm$^2$ have been fabricated and the low amount of Secco defects has even been observed for large diameter substrates, e.g. based on 300 mm wafers. It therefore becomes possible to use this kind of substrate also for memory devices.

What is claimed is:

1. A method for reducing Secco defects in a thinned transfer layer when fabricating a semiconductor on insulator substrate having a surface semiconductor layer, which comprises:
   providing a predetermined splitting area in a source substrate by implanting atomic species with a dose of between 1.9 and $2.3 \times 10^{16}$ atoms/cm$^2$ to define a transfer layer in the source substrate;
   attaching the source substrate to a handle substrate to form a source-handle component;
   detaching the transfer layer from the source substrate from the source-handle component at the predetermined splitting area to thereby transfer that layer from the source substrate to the handle substrate; and
   thinning the transfer layer at a temperature ranging between 850 and 875° C. and for a time of between several minutes and several hours,
   to reduce Secco defect density in the transfer layer by a factor of at least 5 as compared to thinned transfer layers formed at doses and temperatures not in the claimed ranges.

2. The method of claim 1, wherein the atomic species to be implanted include Helium implanted with a dose of $1.2 \times 10^{16}$ atoms/cm$^2$ to $1.4 \times 10^{16}$ atoms/cm$^2$ and Hydrogen implanted with a dose of $0.7 \times 10^{16}$ atoms/cm$^2$ to $0.9 \times 10^{16}$ atoms/cm$^2$.

3. The method of claim 2 wherein the Helium is implanted at an energy of at least 24 keV to 49 keV and the Hydrogen is implanted at an energy of at least 16 keV to 32 keV to further diminish the Secco defect density of the transfer layer.

4. The method of claim 1, which further comprises conducting at least one thermal treatment either before or after the thinning.

5. The method of claim 4, wherein the thermal treatment is a furnace anneal conducted for at least 10 to 240 minutes at a temperature of 1000° C. to 1200° C. and carried out under a non oxidizing atmosphere of Hydrogen, Helium, Argon or mixtures thereof.

6. The method of claim 4, wherein the thermal treatment is a rapid thermal anneal (RTA) having a duration of at least 30 to 90 seconds at a temperature of at least 1200° C. to 1300° C.

7. The method of claim 6, wherein the thermal treatment step comprises two or more successive rapid thermal anneals.

8. The method of claim 1, wherein thinning comprises at least a first and a second thinning step with the second thinning step removing a greater thickness of the transfer layer than that removed by the first thinning step to further diminish the Secco defect density of the transfer layer.

9. The method of claim 8, which further comprises conducting a first temperature treatment after the first thinning step and conducting a second temperature treatment after the second thinning step.

10. The method of claim 9, wherein at least the first temperature treatment is a rapid thermal anneal (RTA) having a duration of at least 30 to 90 seconds at a temperature of at least 1200° C. to 1300° C.

11. The method of claim 1 wherein the thinning comprises sacrificial oxidation of the transfer layer.

12. The method of claim 1 wherein the thinning is achieved by at least one of wet etch, dry etch and etching under HCl and H.

13. The method of claim 1 wherein the transfer layer has a thickness of less than 1000 Å after the thinning and the source and the handle substrate have diameters of 300 mm.

14. The method of claim 1, wherein the Secco defect density in the thinned transfer layer is less than or about 50 defects per cm$^2$.

15. A method of fabricating memory devices comprising:
   providing a semiconductor on insulator substrate having a diameter of approximately 300 mm according to the method of claim 1; and
   fabricating memory devices in the transfer layer of the provided substrate.

16. A method for reducing Secco defects when fabricating a semiconductor on insulator substrate having a thinned surface semiconductor layer, which comprises:
   providing a predetermined splitting area in a source substrate of a mono-crystalline material by implanting atomic species with a total dose of between 1.9 and $2.3 \times 10^{16}$ atoms/cm$^2$ to define a transfer layer in the source substrate;
   attaching the source substrate to a handle substrate by molecular bonding to form a source-handle component;
   detaching the transfer layer from the source substrate from the source-handle component at the predetermined splitting area to thereby transfer that layer from the source substrate to the handle substrate; and
   thinning the transfer layer at a temperature ranging between 850 and 875° C. and for a time of between several minutes and several hours to provide a device layer having a thickness of less than 1000 Å,
   to reduce Secco defect density in the thinned transfer layer by a factor of at least 5 as compared to thinned transfer layers formed at doses and temperatures not in the claimed ranges.

17. A method for reducing Secco defects when fabricating a semiconductor on insulator substrate having a thinned surface semiconductor layer, which comprises:
   providing a predetermined splitting area in a source substrate by implanting atomic species with a total dose of between 1.9 and $2.3 \times 10^{16}$ atoms/cm$^2$ to define a transfer layer in the source substrate;
   attaching the source substrate to a handle substrate to form a source-handle component;
   detaching the transfer layer from the source substrate from the source-handle component at the predetermined splitting area to thereby transfer that layer from the source substrate to the handle substrate; and
   thinning the transfer layer at a temperature ranging between 850 and 875° C. and for a time of between several minutes and several hours to provide a transfer layer having a thickness of less than 1000 Å,
   to reduce a Secco defect density in the thinned transfer layer by a factor of at least 5 as compared to thinned transfer layers formed at doses and temperatures not in the claimed ranges,
   wherein the atomic species to be implanted include Helium implanted with a dose of $1.2 \times 10^{16}$ atoms/cm$^2$ to $1.4 \times 10^{16}$ atoms/cm$^2$ and Hydrogen implanted with a dose of $0.7 \times 10^{16}$ atoms/cm$^2$ to $0.9 \times 10^{16}$ atoms/cm$^2$ with the Helium implanted at an energy of at least 24 keV to 49 keV and the Hydrogen implanted at an energy of at least 16 keV to 32 keV to further diminish the Secco defect density of the transfer layer.

* * * * *